(12) United States Patent
Riethmueller et al.

(10) Patent No.: US 11,764,514 B2
(45) Date of Patent: Sep. 19, 2023

(54) METHOD FOR SEALING A PLUG PIN IN A HOUSING, AND HOUSING DEVICE

(71) Applicant: Robert Bosch GmbH, Stuttgart (DE)

(72) Inventors: Bernd Riethmueller, Stuttgart (DE); Hagen Martin, Treffurt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 196 days.

(21) Appl. No.: 17/414,249

(22) PCT Filed: Oct. 22, 2019

(86) PCT No.: PCT/EP2019/078673
§ 371 (c)(1),
(2) Date: Jun. 15, 2021

(87) PCT Pub. No.: WO2020/126159
PCT Pub. Date: Jun. 25, 2020

(65) Prior Publication Data
US 2022/0052476 A1 Feb. 17, 2022

(30) Foreign Application Priority Data
Dec. 18, 2018 (DE) .......................... 102018222121.9

(51) Int. Cl.
*H01R 13/04* (2006.01)
*H01R 13/52* (2006.01)
*H01R 43/00* (2006.01)

(52) U.S. Cl.
CPC .......... *H01R 13/521* (2013.01); *H01R 13/04* (2013.01); *H01R 43/005* (2013.01); *H01R 13/5216* (2013.01)

(58) Field of Classification Search
CPC .... H01R 13/521; H01R 13/04; H01R 43/005; H01R 13/5216
See application file for complete search history.

(56) References Cited

U.S. PATENT DOCUMENTS

| 7,952,035 B2 * | 5/2011 | Falk | H01R 24/44 174/650 |
| 11,114,791 B1 * | 9/2021 | Lee | H01R 4/70 |
| 2018/0261951 A1 * | 9/2018 | Nagayama | H01R 13/405 |

FOREIGN PATENT DOCUMENTS

| JP | H06203903 A | 7/1994 |
| JP | 2012059624 A | 3/2012 |

(Continued)

OTHER PUBLICATIONS

International Search Report for PCT/EP2019/078673, dated Jan. 29, 2020.

*Primary Examiner* — Tho D Ta
(74) *Attorney, Agent, or Firm* — NORTON ROSE FULBRIGHT US LLP; Gerard Messina

(57) ABSTRACT

A method for sealing a plug pin in a housing. The housing has at least one cutout for sealing a region between plug pin and the housing. The method includes: providing the housing having the plug pin, the plug pin contacting the housing in two edge regions of the plug pin situated opposite one another and running along a direction of insertion, and forming in the edge regions a positive-fit connection with the housing; introducing casting compound into the at least one cutout in such a way that the casting compound reaches two oppositely situated sides of the plug pin, and the casting compound seals the region between the plug pin and the housing in fluid-tight fashion, and the casting compound does not come into contact with the two ends of the plug pin situated opposite one another along the direction of insertion; and curing of the casting compound.

9 Claims, 1 Drawing Sheet

(56) References Cited

FOREIGN PATENT DOCUMENTS

KR            101851626 B1 * 4/2018
WO    WO-2012136446 A1 * 10/2012 ........... H01R 13/521

* cited by examiner

METHOD FOR SEALING A PLUG PIN IN A HOUSING, AND HOUSING DEVICE

FIELD

The present invention relates to a method for sealing a plug pin in a housing, and to a housing device.

BACKGROUND INFORMATION

So-called "stitching" is a low-cost method for introducing plug pins into a housing as an alternative to unmolded plug pins. Plug pins are introduced into a housing in such a way that the plug pin contacts the housing only in two edge regions, situated opposite one another, of the plug pin, and forms a positive-fit connection with the housing only in these edge regions. Above the plug pin and below the plug pin there remains an open intermediate space that forms a permeable connection between the surrounding environment and the interior of the housing.

However, in some applications, e.g., in a sensor device, a connection between the surrounding environment and the interior of the housing is required that is tight, i.e., to fluids, in particular gases, and is non-permeable. Standardly, for this purpose the insertion opening is sealed from the outside of the housing with a casting compound. Alternatively, at the end of the plug pin situated closest to the interior of the housing the connection is sealed with casting material. Here there is the danger that the plug pins will be wetted with casting compound, and in this way the plug pins will lose their functionality, i.e., will no longer function. In addition, the casting of the intermediate space has to take place before sealing the interior of the housing, so that the region around the plug pin can no longer be used for ventilation during the sealing process, e.g., during the curing of the casting material.

SUMMARY

The present invention provides a method for sealing a plug pin in a housing, and a housing device. Advantageous developments and improvements of the present invention result from the description herein and the figures.

Specific embodiments of the present invention can advantageously make it possible to achieve, in a technically simple fashion, a sealing of an interior of the housing against the surrounding environment in the region of a plug pin inserted into the housing.

According to a first aspect of the present invention, a method is provided for sealing a plug pin in a housing, the housing having at least one cutout for sealing a region between the plug pin and the housing and a cutout for casting the plug pin. In accordance with an example embodiment of the present invention, the method includes the following steps:

providing the housing having the plug pin, the plug pin contacting the housing in two edge regions of the plug pin situated opposite one another and running along a direction of insertion, and forming in these edge regions a positive-fit connection with the housing;

introducing casting compound into the at least one cutout in such a way that the casting compound reaches two oppositely situated sides of the plug pin, and that the casting compound seals the region between the plug pin and the housing, in particular in fluid-tight fashion, preferably airtight fashion, and that the casting compound does not come into contact with the two ends, situated opposite one another along the direction of insertion, of the plug pin; and curing of the casting compound. An advantage of this method is that the region of the plug pin, in particular the intermediate space between the plug pin and the housing, can as a rule be sealed in a technically simple fashion. The sealing of this region can typically take place in particular after the sealing of the interior of the housing in other regions, i.e., the intermediate space that is present between the plug pin and the housing before the sealing with casting compound can form the permeable connection between the interior and the surrounding environment. In addition, in general the plug pin does not have to be pre-treated in order to improve an adhesion of the casting compound to the plug pin.

According to a second aspect of the present invention, a housing device is provided. In accordance with an example embodiment of the present invention, the housing device includes a housing and a plug pin, the plug pin being inserted into an insertion opening of the housing along a direction of insertion in such a way that the plug pin contacts the housing in two edge regions, situated opposite one another, of the plug pin, and forms in these edge regions a positive-fit connection with the housing, wherein the housing has at least one cutout for sealing a region between the plug pin and the housing, casting compound being situated in the at least one cutout and on two oppositely situated sides of the plug pin in such a way that the region between the plug pin and the housing is sealed in particular in fluid-tight fashion, preferably in airtight fashion, and that the casting compound does not come into contact with the two ends of the plug pin situated opposite one another along the direction of insertion.

An advantage of this is that the region of the plug pin, in particular the intermediate space between the plug pin and the housing, is sealed in a technically simple fashion. The sealing of this region can typically take place in particular after the sealing of the interior of the housing in other regions, i.e., the intermediate space between the plug pin and the housing, present before the sealing with casting compound, can be the last permeable connection between the interior and the surrounding environment. In addition, in general the plug pin does not have to be pre-treated in order to improve an adhesion of the casting compound to the plug pin.

Ideas relating to specific embodiments of the present invention can also be regarded, inter alia, as applying to the thoughts and findings described in the following.

The present invention provides at least one opening in a housing of a component, such that a casting material can be introduced through the opening of the housing for the airtight sealing of an intermediate space between a plug pin for electrical connection and the housing.

According to a specific embodiment of the method of the present invention, the plug pin has an opening so that the casting compound can move from one side of the plug pin to the other side of the plug pin, the opening being oriented at least partly in alignment with the cutout. An advantage of this is that the housing typically only has to have a single opening, and the casting compound can nonetheless move to both the opposite sides of the plug pin in a technically simple manner. In this way, as a rule the method can be carried out particularly quickly.

According to a specific embodiment of the method of the present invention, the opening has an elliptical, in particular circular, or rectangular cross-section. As a result, the opening can typically be produced in a technically simple manner. In addition, the plug pin has, as a rule, a high mechanical loading capacity.

According to a specific embodiment of the present invention, the housing has two cutouts for introducing the casting compound, situated opposite one another in such a way that the plug pin is situated between the two cutouts in the housing. An advantage of this is that as a rule the plug pin does not have to have an opening, and the casting compound nonetheless moves to the two opposite sides of the plug pin in a technically simple manner.

According to a specific embodiment of the method of the present invention, the casting compound is introduced into the cutout of the housing with a dispensing device, in particular a dispensing needle, in particular in that first the dispensing device is inserted into the cutout, and subsequently casting compound is dispensed from the dispensing device and the dispensing device is moved out of the cutout. An advantage of this is that the casting compound can as a rule be introduced particularly reliably and quickly.

It is also possible for the casting compound to be introduced into the cutout of the housing using a jet method (as, e.g., from inkjet printers).

According to a specific embodiment of the housing device of the present invention, the plug pin has an opening that is oriented at least partly in alignment with the cutout of the housing and is situated in the casting compound. An advantage of this is that the housing typically only has to have a single opening, and the casting compound nonetheless moves to the two opposite sides of the plug pin in a technically simple manner. In this way, the housing device can typically be produced in a technically particularly simple and fast manner.

According to a specific embodiment of the housing device of the present invention, the opening has an elliptical, in particular circular, or rectangular cross-section. In this way, the opening can typically be produced in a technically simple manner. In addition, the plug pin as a rule has a high mechanical loading capacity.

According to a specific embodiment of the housing device of the present invention, the housing has two cutouts situated opposite one another, the two cutouts being situated at two sides situated opposite one another of the plug pin. An advantage of this is that the plug pin does not have to have an opening, and the casting compound nonetheless moves in a technically simple manner to the two opposite sides of the plug pin. As a result, in general the plug pin has a particularly high mechanical loading capacity.

According to a specific embodiment of the housing device of the present invention, the cutout or the cutouts have a funnel-shape, the cutout or the cutouts having a diameter that becomes smaller as one approaches the plug pin.

It is to be noted that some of the possible features and advantages of the present invention are described herein with reference to different specific embodiments of the method for sealing a plug pin in a housing, or of the housing device. The person skilled in the art will recognize that the features can be combined, adapted, or exchanged in a manner suitable for arriving at further specific embodiments of the present invention, in view of the disclosure herein.

BRIEF DESCRIPTION OF THE DRAWINGS

Below, specific embodiments of the present invention are described with reference to the figures; neither the figures nor the description are to be interpreted as limiting the present invention.

The Figures are merely schematic and are not to scale. In the Figures, identical reference characters designate identical features or features having identical function.

DETAILED DESCRIPTION OF EXAMPLE EMBODIMENTS

Figure 1:
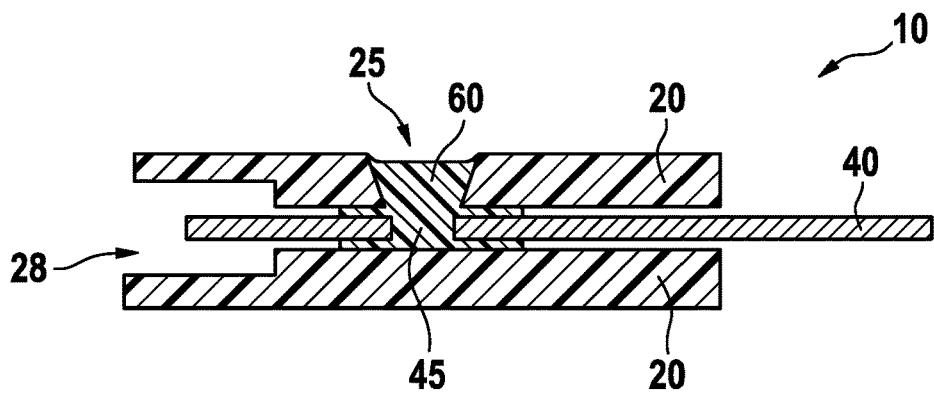
FIG. 1 shows a lateral cross-sectional view of a first specific example embodiment of the housing device according to the present invention.
Figure 2:
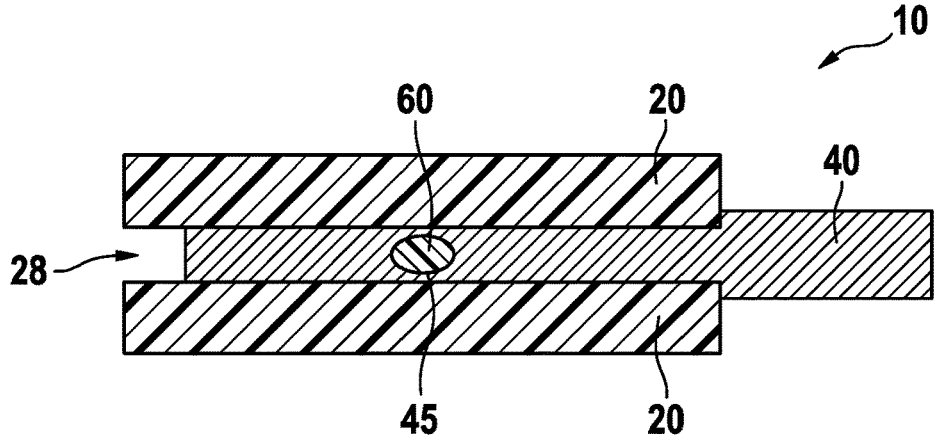
FIG. 2 shows a horizontal cross-sectional view of the housing device of FIG. 1.
Figure 3:
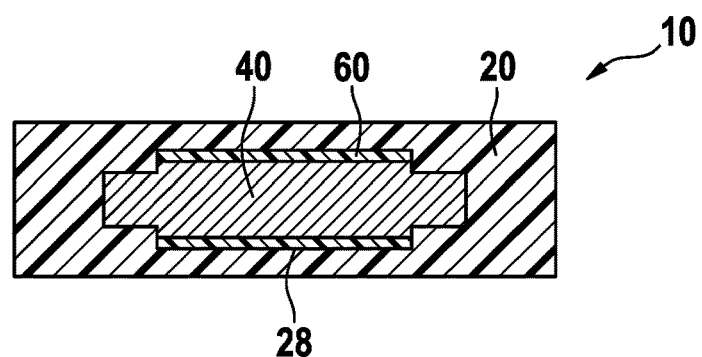
FIG. 3 shows a vertical cross-sectional view of the housing device of FIG. 1 or FIG. 2.

FIG. 1 shows a lateral cross-sectional view of a first specific example embodiment of housing device 10 according to the present invention. FIG. 2 shows a horizontal cross-sectional view of housing device 10 of FIG. 1. FIG. 3 shows a vertical cross-sectional view of housing device 10 of FIG. 1 or FIG. 2.

Housing device 10 includes a housing 20 and a plug pin 40. Housing 20 surrounds a component, e.g., a sensor, and protects the component from the surrounding environment. Plug pin 40 can be used for the electrical connection of the component in housing 20. This means that plug pin 40 forms an electrical connection between the interior of housing 20 and the surrounding environment. A plurality of plug pins 40 may also be present.

Housing 20 has an insertion opening 28 into which plug pin 40 has been inserted or pushed. Plug pin 40 was inserted into housing 20 in the direction of insertion that in FIG. 1 and in FIG. 2 runs from left to right, and in FIG. 3 runs into the plane of the drawing. As can be seen clearly in FIG. 2, plug pin 40 has a larger width than does insertion opening 28. Plug pin 40 touches or contacts housing 20 only in two oppositely situated edge regions (at top and bottom in FIG. 2).

In vertical cross-section (see FIG. 3), insertion opening 28 has a shape that corresponds to two rectangles configured centrically one over the other. The first rectangle has a larger width (running from left to right in FIG. 3) than does the second rectangle. The second rectangle has a larger height (running from top to bottom in FIG. 3) than does the first rectangle. The edges of the rectangles run in part parallel and in part perpendicular to one another. The intermediate space, sealed with casting compound 60, between plug pin 40 and housing 20 is situated in the region that is situated above the first rectangle and still within the second rectangle, i.e., in an area of intersection of the first and second rectangle.

It is also possible for insertion opening 28 to have a rectangular shape in vertical cross-section (see FIG. 3).

This insertion of plug pin 40 in order to form a positive fit is also known as "stitching." Plug pin 40 extends into the interior of housing 20, which in FIG. 1 or FIG. 2 extends to the right from the depicted part of housing 20. The surrounding environment of housing 20 extends to the left from the depicted part of housing 20 in FIG. 1 or FIG. 2.

Housing 20 has a cutout 25, 26 for introducing the casting material. When plug pin 40 has been moved to the provided position (shown in FIGS. 1-3), or has been introduced into insertion opening 28, cutout 25, 26 is situated at a distance from the two ends of plug pin 40 situated opposite one another along the direction of insertion, i.e., the left and right ends of plug pin 40 in FIG. 1 or FIG. 2.

Plug pin 40 has an opening 45 for receiving the casting material. Opening 45 is situated at a distance from the two ends situated opposite one another along the direction of insertion, i.e., the left and right ends of plug pin 40 in FIG. 1 or FIG. 2. Opening 45 can for example have a circular or rectangular cross-section.

Opening 45 is realized such that, or plug pin 40 is inserted or pushed into insertion opening 28 with a depth such that, opening 45 is situated at least partly in orientation with cutout 25, 26 of housing 20. This means that cutout 25, 26 and opening 45 are situated at least partly one over the other in FIG. 1. Preferably, opening 45 of plug pin 40 and cutout 25, 26 of housing 20 are in complete alignment. Opening 45 of plug pin 40 and cutout 25, 26 of housing 20 can have the same cross-section or different cross-sections. Preferably, cutout 25, 26 of housing 20 has a larger cross-section than does cutout 25, 26 of plug pin 40. It is also possible for opening 45 to be configured not in alignment with cutout 25, 26, if the casting compound has a correspondingly low viscosity.

After the introduction of plug pin 40 into housing 20, or insertion opening 28, a fluid, or viscous, casting compound 60 is introduced into cutout 25, 26 of housing 20, or into opening 45 of plug pin 40. Casting compound 60 moves through opening 45 of plug pin 40 to two opposite sides of plug pin 40 (in FIG. 1, the upper and the lower side of plug pin 40), and seals an intermediate space between plug pin 40 and housing 20. Subsequently, the casting material is cured.

After the curing, the region between plug pin 40 and housing 20 is sealed in such a way that no fluid (or gas) can move through this region from the surrounding environment into the interior of housing 20, or exit therefrom into the surrounding environment.

The casting material can be casting compound 60, an adhesive, in particular a silicon-based adhesive, polyurethane, an epoxy resin, or the like. The curing can be carried out, e.g., using a room temperature method, using a shadow curing method with activation by UV or IR radiation.

After the introduction of the casting material and the curing of the casting material, which can take place after the sealing of the rest of the interior against the surrounding environment, housing device 10 is sealed from the surrounding environment. Through plug pin 40, there is an electrical connection between the interior of housing 20, or a component (e.g., sensor) in the interior of housing 20, and the surrounding environment.

Casting compound 60 can be introduced into opening 45 or cutout 25, 26 for example by inserting a dispensing device, e.g., a dispensing needle, into cutout 25, 26 of housing 20, and subsequently into opening 45 of plug pin 40, until for example the dispensing device contacts the side of housing 20 situated directly opposite cutout 25, 26 of housing 20. Casting compound 60 is then for example dispensed from the dispensing device, and the dispensing device is moved out of opening 45 and then out of cutout 25, 26. This movement can take place during the dispensing of casting compound 60, or can take place in alternating fashion with the dispensing of casting compound 60.

Cutout 25, 26 can have a funnel shape, cutout 25, 26 becoming smaller the closer one approaches to plug pin 40.

Plug pin 40, or the part of plug pin 40 that later comes into contact with casting material, can be pre-treated in order to form an improved connection between the casting material and plug pin 40. For this purpose, e.g., the part of plug pin 40 can be roughened with an abrasive material, chemically etched, and/or a plasma activation of this part can be carried out.

Figure 4:
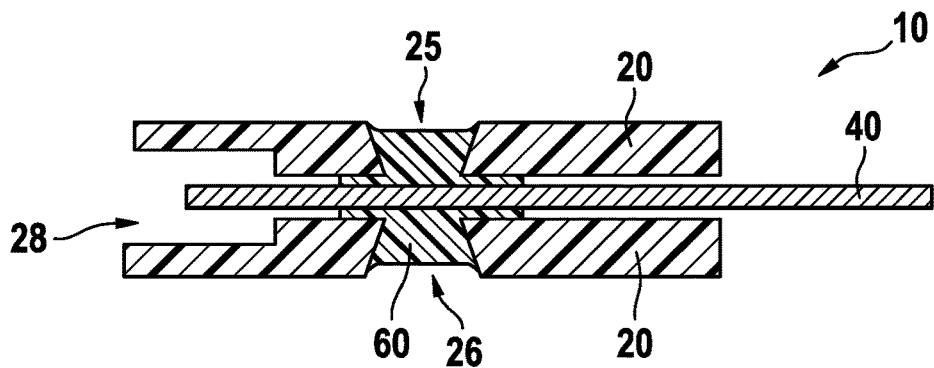
FIG. 4 shows a lateral cross-sectional view of a second specific example embodiment of the housing device according to the present invention.

FIG. 4 shows a lateral cross-sectional view of a second specific example embodiment of housing device 10 according to the present invention.

The second specific example embodiment differs from the first specific embodiment in that plug pin 40 does not have an opening, and housing 20 has two cutouts 25, 26 on two opposite sides of plug pin 40.

Because plug pin 40 does not have an opening, casting compound 60 is introduced into two cutouts 25, 26, situated opposite one another, of housing 20. The two cutouts 25, 26 are situated opposite one another in such a way that plug pin 40 is situated between the two cutouts 25, 26.

A dispensing device, e.g., dispensing needle, for dispensing the casting material can be inserted for example into a first of the two cutouts 25, 26, until for example plug pin 40 is contacted. Subsequently, a casting material is dispensed by the dispensing device, and the dispensing device is moved out of the first of the two cutouts 25, 26. The same takes place for second cutout 25, 26 of housing 20. Here as well, a dispensing device is inserted into cutout 25, 26 until for example the dispensing device contacts plug pin 40. Casting material is then dispensed, and the dispensing device is moved out of cutout 25, 26. The casting material is subsequently cured.

Finally, it is to be noted that terms such as "having," "including," etc., do not exclude any other elements or steps, and terms such as "one" or "a" do not exclude a multiplicity.

What is claimed is:

1. A method for sealing a plug pin in a housing, the housing having at least one cutout for sealing a region between the plug pin and the housing, the method comprising the following steps:
   providing the housing having the plug pin, the plug pin contacting the housing in two edge regions of the plug pin situated opposite one another and running along a direction of insertion, and forming in the edge regions a positive-fit connection with the housing;
   introducing casting compound into the at least one cutout in such a way that the casting compound reaches two oppositely situated sides of the plug pin, and that the casting compound seals the region between the plug pin and the housing in fluid-tight fashion, and that the casting compound does not come into contact with two ends of the plug pin situated opposite one another along the direction of insertion; and
   curing of the casting compound,
   wherein the plug pin has an opening so that the casting compound can move from one side of the plug pin to the other side of the plug pin, the opening being oriented at least partly in alignment with the cutout.

2. The method as recited in claim 1, wherein the casting compound is introduced in the at least one cutout in such a way that the casting compound seals the region between the plug pin and the housing in airtight fashion.

3. The method as recited in claim 1, wherein the opening has an elliptical or circular or rectangular cross-section.

4. The method as recited in claim 1, wherein the at least one cutout of the housing includes two cutouts for introducing the casting compound, the two cutouts being situated opposite one another in such a way that the plug pin is situated between the two cutouts in the housing.

5. The method as recited in claim 1, wherein the casting compound is introduced into the cutout of the housing with a dispensing device, the dispensing device being a dispensing needle, wherein first the dispensing device is introduced into the cutout until the dispensing device has moved through the cutout of the housing, and subsequently the casting compound is dispensed from the dispensing device and the dispensing device is moved out of the cutout.

6. A housing device, comprising:

a housing; and a plug pin, the plug pin being inserted into an insertion opening of the housing along a direction of insertion in such a way that the plug pin contacts the housing in two edge regions, situated opposite one another, of the plug pin, and forms in the edge regions a positive-fit connection with the housing;

wherein the housing has at least one cutout for sealing a region between the plug pin and the housing, casting compound being situated in the at least one cutout and on two oppositely situated sides of the plug pin in such a way that the region between the plug pin and the housing is sealed in fluid-tight fashion, and in airtight fashion, and that the casting compound does not come into contact with two ends, situated opposite one another along the direction of insertion, of the plug pin, wherein the plug pin has an opening that is oriented at least partly in alignment with the cutout of the housing and that is situated in the casting compound.

7. The housing device as recited in claim 6, wherein the opening has an elliptical or circular or rectangular cross-section.

8. The housing device as recited in claim 6, wherein at least one cutout of the housing includes two cutouts, the two cutouts being situated opposite one another, the two cutouts being situated on two sides situated opposite one another of the plug pin.

9. The housing device as recited in claim 6, wherein the at least one cutout has a funnel shape, the at least one cutout having a diameter that becomes smaller as it approaches the plug pin.

\* \* \* \* \*